US005789322A

United States Patent [19]
Brown et al.

[11] Patent Number: 5,789,322
[45] Date of Patent: *Aug. 4, 1998

[54] LOW VOLUME GAS DISTRIBUTION ASSEMBLY FOR A CHEMICAL DOWNSTREAM ETCH TOOL

[75] Inventors: William Brown, San Jose; Harald Herchen, Fremont; Ihi Nzeadibe, San Jose; Walter Merry, Cupertino, all of Calif.

[73] Assignee: Applied Materials, Inc., Santa Clara, Calif.

[ * ] Notice: The term of this patent shall not extend beyond the expiration date of Pat. No. 5,728,260.

[21] Appl. No.: 870,110

[22] Filed: Jun. 5, 1997

Related U.S. Application Data

[63] Continuation of Ser. No. 654,958, May 29, 1996.

[51] Int. Cl.$^6$ .............................. C23C 16/00; H01L 21/00
[52] U.S. Cl. ..................... 438/689; 438/758; 156/345; 118/723 R; 118/715; 204/298.07; 204/298.11; 204/298.33
[58] Field of Search ................ 156/345; 118/723 R, 118/723 MW, 723 ME, 723 E, 723 ER, 723 I, 723 IR, 715; 204/298.07, 298.11, 298.33; 216/58, 67; 438/710, 689, 758

[56] References Cited

U.S. PATENT DOCUMENTS

| | | |
|---|---|---|
| 4,401,052 | 8/1983 | Baron et al. .................. 118/718 |
| 4,693,211 | 9/1987 | Ogami et al. .................. 118/725 |
| 4,817,558 | 4/1989 | Itoh ............................. 118/725 |
| 4,870,923 | 10/1989 | Sugimoto ...................... 118/715 |
| 5,304,250 | 4/1994 | Sameshima et al. ........ 118/723 ER |
| 5,366,557 | 11/1994 | Yu .............................. 118/725 |
| 5,368,646 | 11/1994 | Yasuda et al. ............... 118/723 R |
| 5,522,936 | 6/1996 | Tamura ....................... 118/723 R |
| 5,542,559 | 8/1996 | Kawakami et al. ............... 216/67 |
| 5,690,795 | 11/1997 | Rosenstein et al. ............. 204/192.1 |

FOREIGN PATENT DOCUMENTS

WO 87/07310  12/1987  WIPO .

Primary Examiner—R. Bruce Breneman
Assistant Examiner—Luz Alejandro
Attorney, Agent, or Firm—Michael A. Glenn

[57] ABSTRACT

An improved low-volume gas distribution assembly for a chemical downstream etch tool includes a focusing collar positioned within a process chamber and having a depending shroud in close proximity to a wafer chuck. An apertured gas delivery conduit rests on channels formed in slanted sides of a central tube of the focusing collar. The apertures in the gas delivery conduit are patterned and dimensioned to provide substantially uniform distribution of a process gas over the upper surface of the workpiece. The central tube is sealed with a cover plate and the process chamber is covered with a chamber lid.

20 Claims, 4 Drawing Sheets

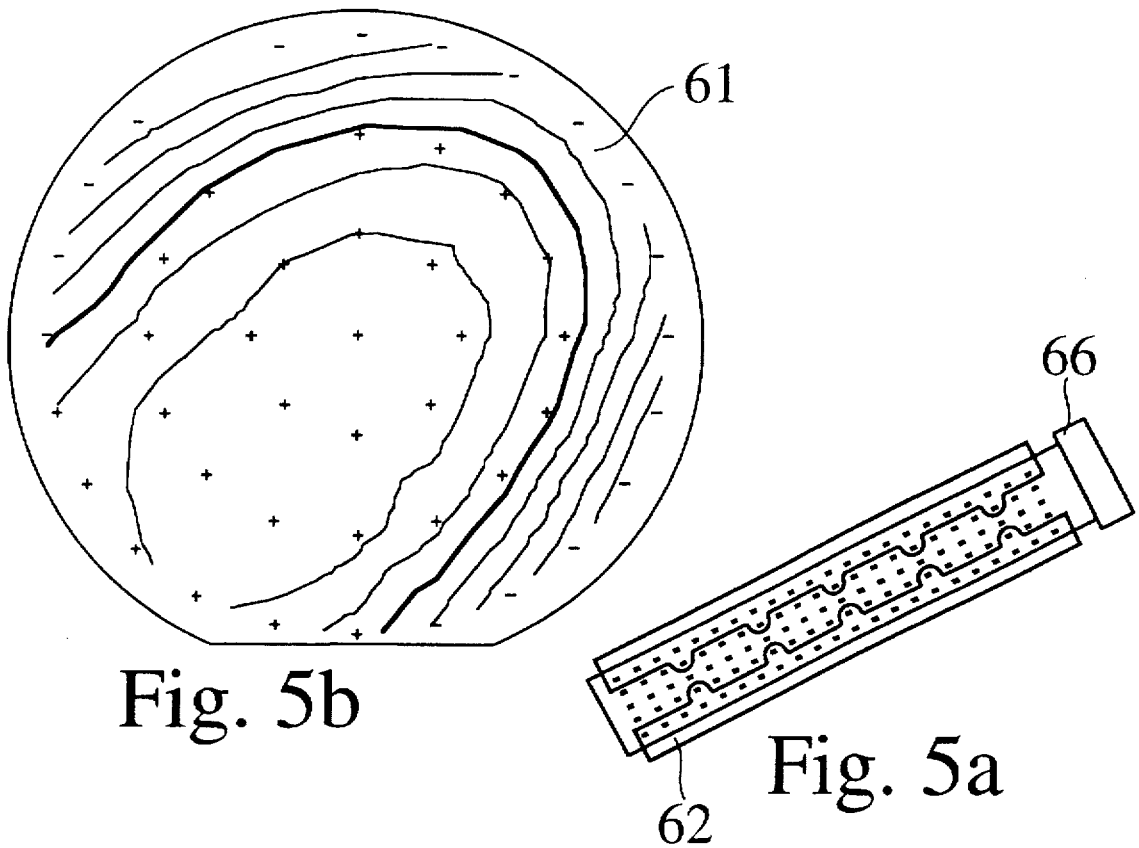
Fig. 5b
Fig. 5a
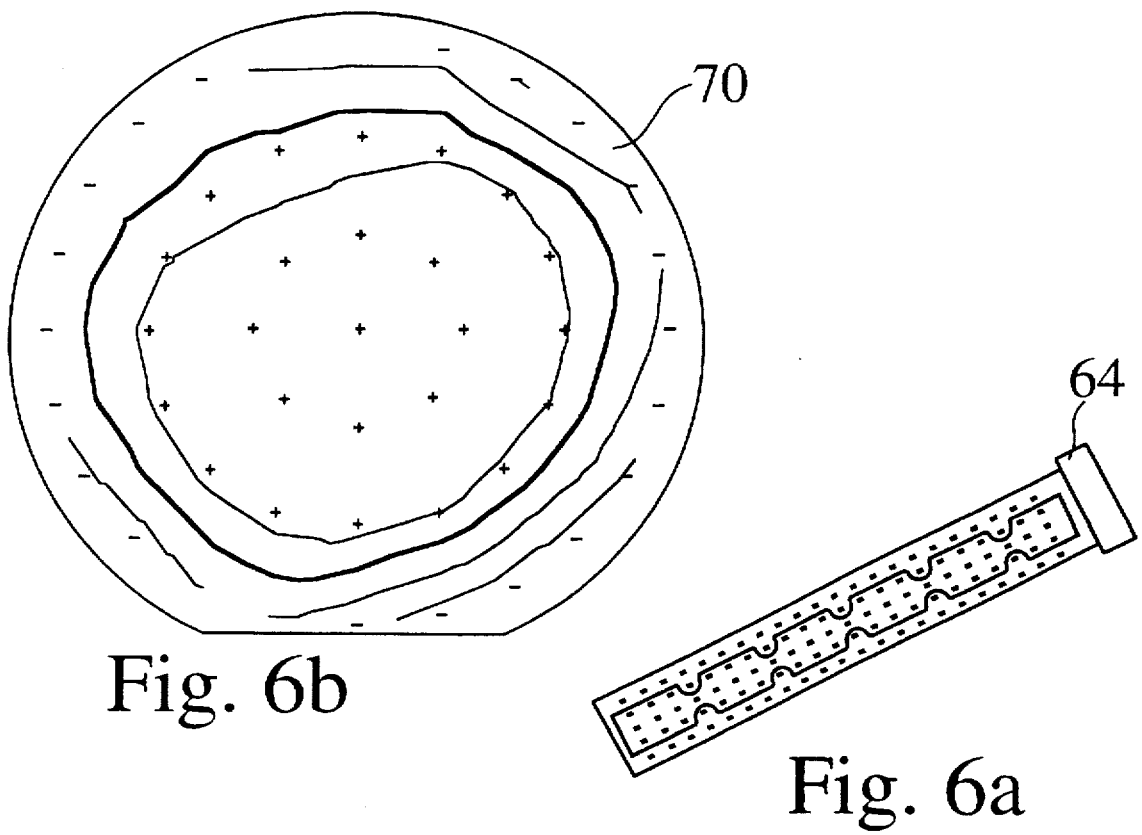
Fig. 6b
Fig. 6a

LOW VOLUME GAS DISTRIBUTION ASSEMBLY FOR A CHEMICAL DOWNSTREAM ETCH TOOL

This is a continuation of application Ser. No. 08/654.958 filed on May 29, 1996.

BACKGROUND OF THE INVENTION

1. Technical Field

The invention relates to plasma processing and plasma processing equipment. More particularly, the invention relates to an apparatus for minimizing effective volume through which reactive species are delivered to a workpiece during isotropic dry etch, thereby optimizing the distribution of the reactive species over the workpiece.

2. Description of the Prior Art

Plasma processing is an essential tool of the semiconductor manufacturing industry. Such processing uses electromagnetic radiation to dissociate the molecules of a process gas to generate a plasma and thereby produce reactive species that are used for such processes as wafer etching. A plasma may be produced directly above the surface of the wafer within the process environment, or the plasma may be remotely generated in an applicator and then conducted to the surface of the wafer. Some state of the art plasma applicators comprise a tube that is open at least one end, and through which a process gas is fed. The reactive gas is supplied from a source and may comprise such gases as $CF_2$, $O_2$, $N_2$, $Cl_2$, and $NF_3$.

The tube also has an area in its side that includes a waveguide through which a source of electromagnetic energy may enter to ignite and maintain a plasma within the tube. The source of electromagnetic energy may be a microwave signal (typically having a frequency of 2.45 GHz). The plasma thus generates reactive species that are directed out of an open end of the tube, through a transport conduit, and toward the process chamber.

The effluent of the plasma is delivered to the process chamber through a gas diffusion plate that is typically used to spread the reactive species for even distribution within the process chamber. The reactive species are directed towards a workpiece, typically a semiconductor wafer, and thence the spent process gas is exhausted from the process chamber through an exhaust port.

One problem encountered in the prior art is that of species recombination. Reactive species that are not quickly delivered from the applicator produce a resulting pressure differential that increases the internal pressure in the region of the process chamber above the gas diffusion plate, thereby promoting recombination and reducing the etch rate.

An isotropic etch proceeds equally in all directions. To maintain etch uniformity, it is critically important to provide a uniform distribution of reactive species over the wafer. Prior art gas distribution plates do not entirely compensate for variations in gas distribution caused by reactive species concentration and delivery rates, the volume of the process chamber, and recombination. Thus, in the prior art isotropic dry etch chambers only minimal progress has been made to reduce residence time of reactive species during transit to the wafer surface.

Typically, there is an optimal pressure difference between the interior and the exterior of a gas delivery tube that causes a uniform injection of process gas into the region of the process chamber proximate to the wafer surface. Increasing the pressure drop permits increasingly equalized process gas flow. However, such a pressure increase within the gas delivery tube increases the recombination rate of the reactive species atoms, thereby reducing the etch rate.

The plasma generated within the applicator contains ions and electrons as well as the desired reactive species. Any charged species present in the process gas delivered from the applicator can produce local variations in the electric field within the vacuum process chamber. Such induced variations in the electric field may cause problems including charge-up damage or gate oxide integrity violations, thereby very rapidly degrading wafer yields. It is thus of critical importance to minimize the charged species within the plasma, while directing the desired reactive species to the wafer.

It would therefore be advantageous to provide a gas distribution assembly that optimizes the distribution of reactive species over a wafer during an etch process. It would be a further advantage if such an assembly minimized the effective volume through which the gas is delivered, while also exhibiting a minimal pressure differential across the gas distribution assembly, thereby increasing the etch rate and minimizing the likelihood of active species recombination.

SUMMARY OF THE INVENTION

The invention provides an improved low-volume gas distribution assembly for a chemical downstream etch tool. A focusing collar has an outer projection dimensioned to position the focusing collar within the process chamber. A shroud depends from the focusing collar and is situated in close proximity to a wafer chuck, thereby reducing the effective volume through which reactive species are delivered to the workpiece. An apertured gas delivery conduit rests on channels formed in the top of the focusing collar. The apertures in the gas delivery conduit are patterned and dimensioned to provide substantially uniform distribution of the reactive species over the wafer. The top of the focusing collar is sealed with a cover plate, and the vacuum process chamber is covered with a chamber lid.

BRIEF DESCRIPTION OF THE DRAWINGS

FIG. 3b is a top view of the pattern of gas distribution over a wafer using the gas distribution conduit of FIG. 3a;

FIG. 4b is a top view of the pattern of gas distribution over a wafer using the gas distribution conduit of FIG. 4a;

FIG. 5a is a side view of one embodiment of the gas distribution conduit according to the invention;

FIG. 5b is a top view of the pattern of gas distribution over a wafer using the gas distribution conduit of FIG. 5a;

FIG. 6a is a side view of the presently preferred embodiment of the gas distribution conduit according to the invention; and FIG. 6b is a top view of the pattern of gas distribution over a wafer using the gas distribution conduit of FIG. 6a.

DETAILED DESCRIPTION OF THE INVENTION

The invention provides an improved low-volume gas distribution assembly for a chemical downstream etch tool.

Figure 1:
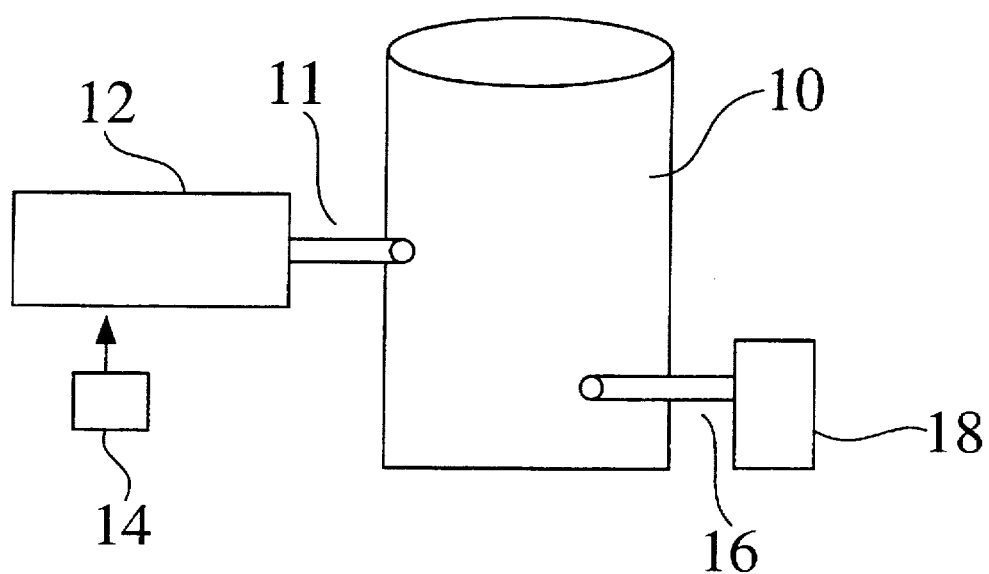
FIG. 1 is a side view of a typical applicator and vacuum process chamber with which the invention is intended to operate.

FIG. 1 is a side view of a typical applicator 12 and vacuum process chamber 10 with which the invention is intended to operate. In the preferred embodiment of the invention, a plasma is remotely generated in the applicator, and then conducted to the surface of a workpiece within the vacuum process chamber. In one embodiment of the invention, the applicator is a tube that is open at least one end, and through which a process gas is fed. This process gas is typically a fluorine-containing compound. It will be readily appreciated by one skilled in the art that other applicator configurations may be used without departing from the scope and spirit of the invention.

The tube also includes a waveguide through which a source of electromagnetic energy 14 may enter to ignite and maintain a plasma within the tube. In the preferred embodiment of the invention, the source of electromagnetic energy is a microwave signal. However, in alternate embodiments of the invention, the source may comprise an RF signal. The plasma thus generated is directed out of the open end of the tube, through a transport conduit 11, and toward the process chamber. As the process gas is spent during wafer processing it is exhausted from the process chamber through an exhaust port 16, for example with a dry blower and/or a dry vacuum pump and/or a combination thereof 18. The preferred embodiment of the invention operates in a pressure range of from approximately 300 milliTorr to 3 Torr. Alternate embodiments of the invention are adapted for use with different pressure ranges.

Figure 2:
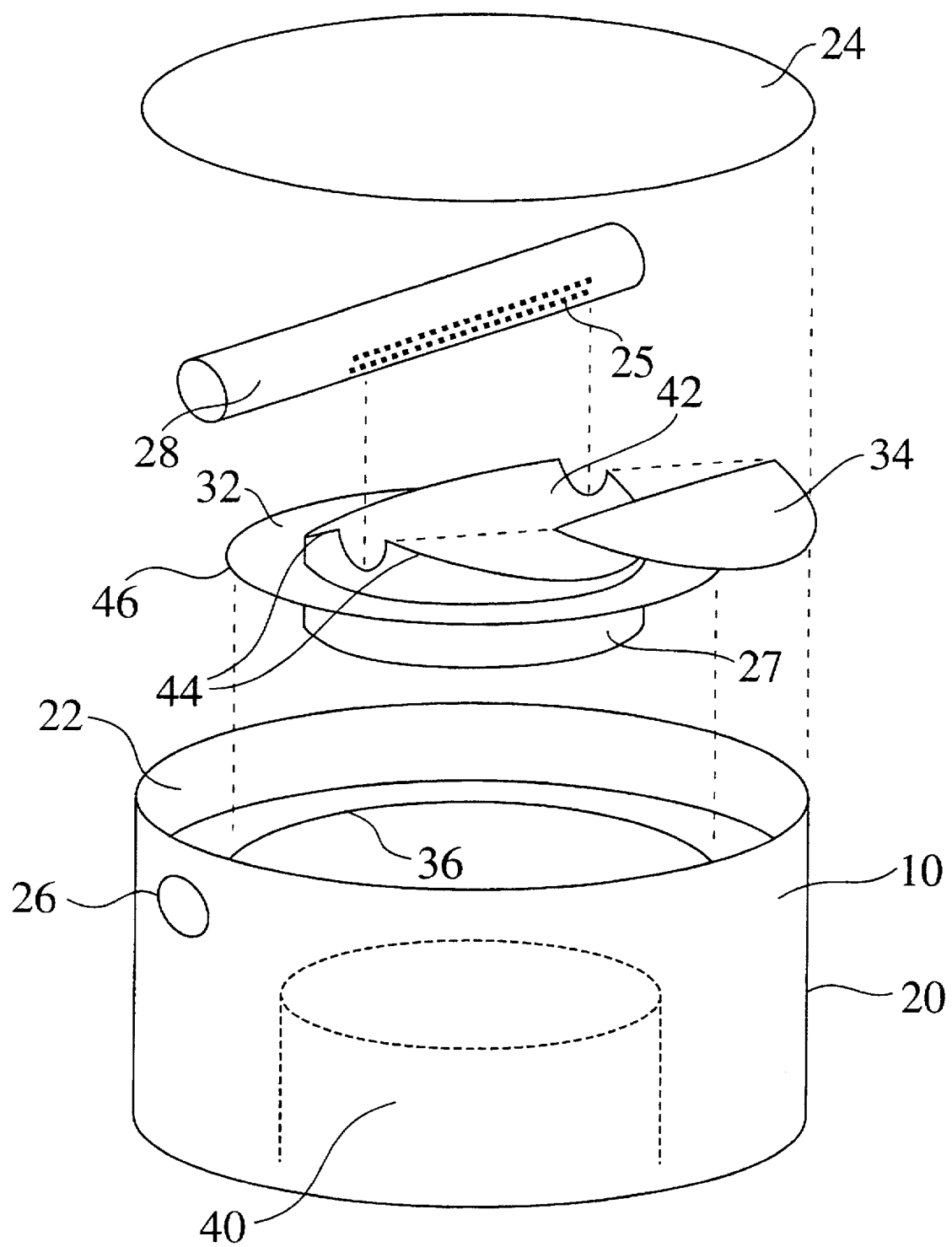
FIG. 2 is an exploded perspective view of the low-volume gas distribution assembly according to the invention.

FIG. 2 is an exploded perspective view of the low-volume gas distribution assembly according to the invention. The vacuum process chamber 10 is formed of a body 20 having a coaxial liner 22 contained therewithin. A shelf 36 is radially disposed within the liner and projects into the chamber. A chamber lid 24 seals the chamber to maintain the vacuum within. The workpiece (not shown) is supported within the chamber by a wafer chuck 40.

In the preferred embodiment of the invention, the applicator is mounted on the side of the chamber and delivers reactive species through a port formed in the chamber 26. However, in alternate embodiments of the invention the applicator is mounted in other configurations, including vertical and angled placement. The reactive species enter into the process chamber through an internally mounted apertured gas delivery conduit 28. Apertures 25 are formed through the side of the conduit that is directed towards the chamber. The gas delivery conduit is preferably cylindrical in shape. However, in other embodiments of the invention the shape of the gas delivery conduit is readily adapted to the specific patterning required to deliver the reactive species effectively to the workpiece.

The gas delivery conduit is structurally supported within the chamber by a focusing collar 32 that has a central tube 42 placed therethrough. A lip 46 radially disposed about the focusing collar to allow the collar to rest on the shelf, thereby securely positioning the focusing collar within the process chamber. In the preferred embodiment of the invention, the central tube of the focusing collar has a channel formed therethrough to engage with and securely hold the gas delivery conduit in place. The channel is dimensioned to position the gas delivery conduit so that all of the conduit apertures are directed towards the chamber.

A shroud 27 depends from the focusing collar to within a close proximity of the wafer chuck. The shroud minimizes the effective volume through which the reactive species are directed to the workpiece. The apertures 25 in the gas delivery conduit are directed through the central tube and shroud and towards the wafer chuck within the process chamber.

At least one cover 34 may be provided to seal the central tube. In the preferred embodiment of the invention, two covers are used, one on each side of the gas delivery conduit. The covers extend to the sides of the gas delivery conduit and fill in the gap around the perimeter of the focusing collar. Covering the focusing collar defines a smaller volume within the collar than that of the chamber. The larger the volume through which reactive species pass, the greater the resonance time of fluorinating atoms in that region, and the greater the recombination of the fluorine. This recombination lowers the etch rate. Thus, this smaller volume defined by the focusing collar minimizes the rate of recombination of the reactive species, thereby increasing the etch rate of the process.

In the preferred embodiment of the invention, the central tube of the focusing collar has slanted sides 44. These slanted sides further act to minimize the volume contained within the collar and through which the gas is delivered. In alternate embodiments of the invention, the sides of the central tube may be beveled, curved, or stepped. The focusing collar thus directs the gas down to the workpiece as quickly as possible through as little of an effective volume as possible.

The focusing collar is spaced as close to the workpiece as possible, in the preferred embodiment of the invention, to localize the reactive species to the workpiece. The distance between the focusing collar and the workpiece is constrained by the spacing required to position or lift the wafer. In a manual wafer handling system, the focusing collar is preferably maintained at a distance of approximately 1¼ to 1½ inches from the top of the wafer chuck. In one embodiment of the invention, the focusing collar makes a seal against the wafer chuck. The gases are pumped out, for example through perforations in the chuck around the perimeter of the wafer.

The inner diameter of the focusing collar is optimally larger than the outer diameter of the workpiece. In the Examples set forth below, the wafer outer diameter is 8 inches and the inner diameter of the focusing collar is 8.5 inches.

The pattern of gas delivered to the wafer is also significantly affected by the height of the focusing collar. If the focusing collar is too short, the gases do not travel far enough to have a uniform flow. A shadow in the shape of the gas delivery conduit falls on the wafer, creating hot spots. A taller focusing collar promotes better mixing of the gas and better potential uniformity of the gas flow down to the wafer. However, such a taller focusing collar also introduces a larger effective volume, thereby causing extensive recombination of the fluorine and a reduced etch rate. In the preferred embodiment of the invention, the focusing collar for use with an 8-inch wafer is approximately 4 to 5 inches tall. The reactive species are thereby confined as close as possible within the region of the wafer to prevent recombination, but not so close as to be unevenly displaced.

In the preferred embodiment of the invention, the chamber has an outer diameter of approximately 14 to 15 inches and an inner diameter of approximately 13 inches. The focusing collar preferably has a diameter of approximately 10 inches. The wafer chuck in such a chamber is typically approximately 10 inches in diameter. However, it is readily appreciated by one skilled in the art that the assembly according to the invention is easily adapted to differently-sized process chambers and also depends upon the size of the wafer that is being processed.

It is important that chemical reactions between the gases and the walls of the applicator and chamber be avoided. It is thought that such chemical reactions promote recombination of the atomic fluorine by two different mechanisms. In gas phase volume recombination, the fluorine atoms participate in a collision that creates an $F_2$ molecule that is not chemically active in the etch. In surface recombination, the fluorine atoms absorb onto a surface in an interior part of the chamber. When in the absorbed state, the atoms can also recombine with one another. The choice of coating materials for the invention is therefore critical. Coating with Teflon™ greatly reduces the rate of surface recombination. The chamber body is preferably made out of aluminum because of its structural strength. The aluminum is coated with a proprietary TeflonTM coating, known by the trade name of MALYNCO31015 produced by Lynn Industries of Idaho. The coating is clear PFA with a primer and has an overall coating thickness of about 0.003 to 0.005 inches. The focusing collar and covers are also preferably formed of Teflon-coated aluminum. However, other suitable materials may be used without significantly departing from the scope and spirit of the invention.

It is an object of the invention to provide a uniform distribution of reactive species over the workpiece. The apertures in the gas delivery conduit according to the invention are patterned and dimensioned to optimize this gas flow distribution. These patterns and dimensions are determined according to the particular dimensions of the process chamber components, the workpiece, as well as of the low-volume gas distribution assembly of the invention.

In one preferred embodiment of the invention, the gas delivery conduit is fabricated in accordance with the desired aperture locations and sizes. In another equally preferred embodiment of the invention, a prefabricated conduit is adapted to particular requirements by sealing or drilling apertures, or by modifying the aperture sizes.

The shape of the gas delivery conduit is determined by the materials used. A limited number of materials are available for use in a processing environment. In the preferred embodiment of the invention, the gas delivery conduit is formed of sapphire. Synthetic sapphire has superior purity and durability to other suitable materials and is sufficiently chemically and thermally resistant to the downstream gases. A single-crystal sapphire tube is the preferred shape of the gas delivery conduit. However, other materials, such as PTFE Teflon™, are appropriate for the gas delivery conduit. A Teflon™ gas delivery conduit typically has a greater wall thickness than the sapphire conduit. Thus, in alternate embodiments of the invention, the gas delivery conduit has different shapes, such as a showerhead.

In the preferred embodiment of the invention, the sapphire gas delivery conduit is perforated at the bottom with apertures through which the gases are delivered to the chamber. The sapphire tube preferably has a diameter of approximately 1 inch. The number of apertures is highly variable, depending on other specific features of the gas delivery conduit geometry. A sapphire gas delivery conduit according to the invention typically has between 20 and 100 apertures. Aperture diameters can range up to ³⁄₁₆th of an inch in diameter. However, the optimum diameter range is between approximately 0.1 to 2.14 inches.

Examples 1-4 include the results from the experimental use of several different embodiments of the gas delivery conduit according to the invention. A pressure of 2.5 Torr was applied in all Examples.

EXAMPLE #1

Figure 3B:
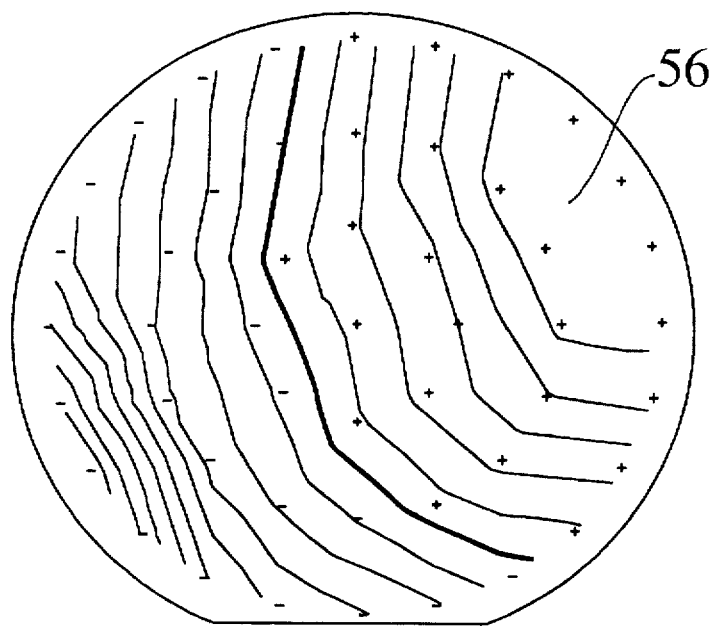
Figure 3A:
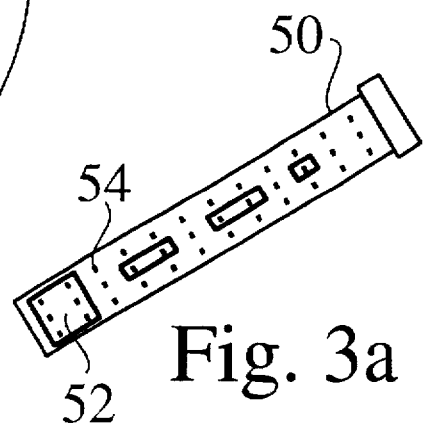
FIG. 3a is a side view of a first unsuccessful embodiment of the gas distribution conduit according to the invention.

FIG. 3a is a side view of the gas delivery conduit 50 used in a first unsuccessful embodiment, showing the arrangement of sealed 52 and open 54 apertures. FIG. 3b is a top view of the resulting gas distribution pattern 56 over a wafer.

Hole diameter=¼"

| E.R. | 2168 Angstrom/minute |
| --- | --- |
| UNIF % 1 Sigma | 19.1% |
| PRESSURE | 2.5 Torr |

The aperture pattern of this Example produced a low etch rate of 2168 Angstrom/minute, and poor uniformity of distribution over the wafer.

EXAMPLE #2

Figure 4B:
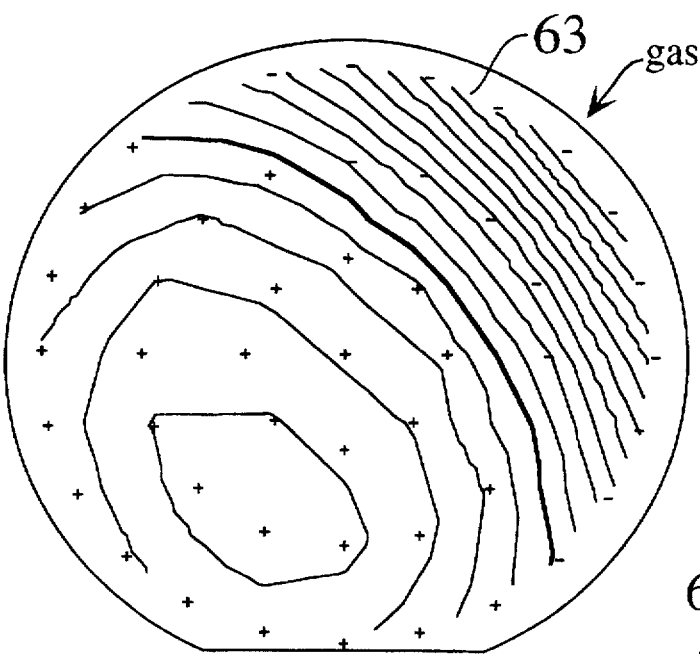
Figure 4A:
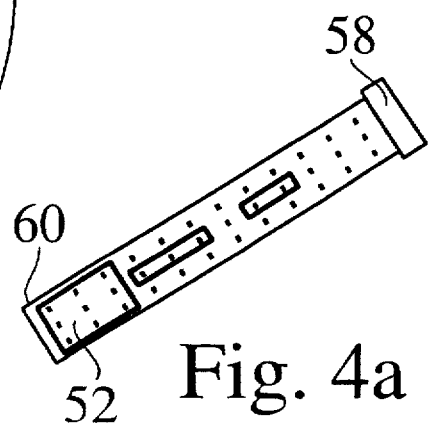
FIG. 4a is a side view of a second unsuccessful embodiment of the gas distribution conduit according to the invention.

FIG. 4a is a side view of a second unsuccessful embodiment 58 of the gas delivery conduit according to the invention. FIG. 4b is a top view of the pattern of gas distribution 59 over a wafer using the conduit of FIG. 4a.

Hole diameter=¼"

| E.R. | 2598 Angstrom/minute |
| --- | --- |
| UNIF % 1 Sigma | 16.5% |
| PRESSURE | 2.5 Torr |

Even with extensive taping 52 at the end of tube opposite the applicator 60, the etch rate was faster at that side of the wafer. The pattern of gas distribution was again irregular in this Example.

EXAMPLE #3

FIG. 5a is a side view of one embodiment of the gas delivery conduit 66 according to the invention. A top view of the pattern of gas distribution over a wafer 61 using the gas delivery conduit of FIG. 5a is shown in FIG. 5b.

Hole diameter=¼"

| E.R. | 2730 Angstrom/minute |
| --- | --- |
| UNIF % 1 Sigma | 8.8% |
| PRESSURE | 2.5 Torr |

The apertures of the gas delivery conduit of this Example were extensively taped at the edges 62 of the conduit. This embodiment of the invention provided a more uniform pattern of gas distribution over the wafer 61.

EXAMPLE # 4

FIG. 6a is a side view of the presently preferred embodiment of the gas delivery conduit according to the invention. FIG. 6b is a top view of gas distributed over a wafer 70 using the gas delivery conduit of FIG. 6a.

Hole diameter=⅛"

| POWER | 1400 W |
| --- | --- |
| PRESSURE | 3 Torr |
| TEMPERATURE | 100° C. |
| NF3 FLOW | 412 Sccm |
| CF4 FLOW | 824 Sccm |
| O2 FLOW | 264 Sccm |
| E.R. | 2418 Angstrom/minute |
| UNIF % 1 Sigma | 6.3% |
| PRESSURE | 2.5 Torr |

The etch rate of 2418 Angstrom/minute is sufficiently high. Furthermore, etch uniformity is optimal using the aperture pattern and dimensions of FIG. 6a. The apertures of the gas delivery conduit of this Example were extensively taped at the central region of the conduit 64.

The design of the gas delivery conduit differs from the showerhead-type structure of the prior art. In the prior art showerhead, a pressure difference between the interior and the exterior of the showerhead causes a uniform gas flow from aperture to aperture in the showerhead. Increasing the pressure drop permits increasingly equalized flow between apertures. However, such a pressure increase within the delivery conduit increases the recombination rate of the fluorine atoms thereby reducing the etch rate. However, a showerhead-shaped embodiment of the gas delivery conduit according to the invention relies on minimizing the pressure differential to provide a uniform gas flow distribution over the wafer. The aperture pattern and dimensions in the gas delivery conduit according to the invention are deliberately tailored to direct the gases over the wafer in an optimized, uniform flow with the minimum internal pressure possible in the tube.

Although the invention is described herein with reference to the preferred embodiment, one skilled in the art will readily appreciate that other applications may be substituted for those set forth herein without departing from the spirit and scope of the present invention. Accordingly, the invention should only be limited by the claims included below.

We claim:

1. An apparatus for distributing a process gas within a process chamber, comprising:
   a delivery conduit having a pattern of apertures formed therethrough for delivering said process gas from an applicator to said process chamber, wherein said apertures are patterned and dimensioned to provide substantially uniform distribution of said process gas across an upper surface of a workpiece within said process chamber;
   a focusing collar having a central tube projecting therethrough, said collar adapted to engage with said delivery conduit, said focusing collar including a shroud adapted to confine said process gas to within a close proximity of said workpiece upper surface.

2. The apparatus of claim 1, wherein said delivery conduit comprises a process gas delivery tube having a central aperture defined therethrough.

3. The apparatus of claim 2, wherein said process gas delivery tube is made of sapphire.

4. The apparatus of claim 2, wherein said central aperture has a diameter of approximately 1 inch.

5. The apparatus of claim 1, wherein said shroud is larger in diameter than said workpiece.

6. The apparatus of claim 1, wherein said process chamber is made of Teflon™-coated aluminum.

7. The apparatus of claim 1, wherein said focusing collar is made of Teflon™-coated aluminum.

8. The apparatus of claim 1, further comprising:
   at least one cover for sealing said control tube of said focusing collar, wherein said cover is optionally made of Teflon™-coated aluminum.

9. The apparatus of claim 1, further comprising:
   positioning said focusing collar within said process chamber;
   a shelf adapted to be radially disposed within said process chamber; and
   a lip radially disposed about said focusing collar, said lip resting on said shelf, said lip and shelf adapted for positioning said focusing collar.

10. The apparatus of claim 9, wherein said lip has a diameter of approximately 10 inches.

11. The apparatus of claim 1, wherein said central tube has slanted sides to minimize the volume through which said process gas is delivered.

12. The apparatus claim 11, wherein said slanted sides have a channel formed therethrough to receive and support said delivery conduit.

13. The apparatus of claim 9, further comprising a liner dimensioned for coaxial insertion within said process chamber, wherein said liner, said focusing collar, and said cover comprise a unitary machined assembly.

14. An apparatus for distributing a process gas within a process chamber, comprising:
   a delivery conduit having a pattern of apertures formed therethrough for delivering said process gas to said process chamber, wherein said apertures are patterned and dimensioned to provide substantially uniform distribution of said process gas over an upper of a workpiece within said process chamber; and
   a focusing collar having a central tube formed therethrough, said focusing collar adapted to engage with said delivery conduit, said focusing collar including a shroud adapted to confine said process gas to within a close proximity of said workpiece, said central tube further comprising slanted sides to minimize a volume through which said process gas is delivered, said slanted sides having formed therethrough a channel to receive and support said delivery conduit;
   wherein said process gas is directed from said delivery conduit to said workpiece.

15. The apparatus of claim 14, further comprising:
   at least one cover for sealing said central tube of said focusing collar.

16. The apparatus of claim 14, further comprising:
   a liner dimensioned for coaxial insertion within said process chamber and having a shelf disposed about a perimeter thereof; and
   a lip disposed about a perimeter of said focusing collar, said lip resting on said shelf, wherein said focusing collar is adapted to be positioned within said process chamber and supported in close proximity to said workpiece.

17. The apparatus of claim 14, wherein said apertured gas delivery conduit comprises a tube having a central aperture defined therethrough.

18. The apparatus of claim 14, wherein said tube is made of sapphire.

19. A process for distributing a process gas within a process chamber, comprising the steps of:
   providing a delivery conduit having aperatures for delivering said process gas to said process chamber, said apertures patterned and dimensioned to provide substantially uniform distribution of said process gas over a wafer within said process chamber;
   disposing a focusing collar having a central tube therethrough within said process chamber, where said focusing collar is adapted to engage with said delivery conduit; and
   providing shroud to said focusing collar such that shroud is within a close proximity to said wafer to minimize the volume within said process chamber through which said process gas is delivered.

20. The process of claim 19, further comprising the steps of:
   covering said central tube of said focusing collar, wherein said process gas is directed from said delivery conduit to said wafer.

* * * * *